(12) United States Patent
Schnetzler et al.

(10) Patent No.: US 11,569,436 B2
(45) Date of Patent: Jan. 31, 2023

(54) ACTUATOR DEVICE AND METHOD FOR OPERATING AN ACTUATOR DEVICE

(71) Applicant: ETO MAGNETIC GmbH, Stockach (DE)

(72) Inventors: René Schnetzler, Messkirch (DE); Thomas Schiepp, Seitingen-Oberflacht (DE); Harald Eckhardt, Uhldingen-Muehlhofen (DE)

(73) Assignee: ETO MAGNETIC GmbH, Stockach (DE)

( * ) Notice: Subject to any disclaimer, the term of this patent is extended or adjusted under 35 U.S.C. 154(b) by 716 days.

(21) Appl. No.: 16/493,483

(22) PCT Filed: Mar. 15, 2018

(86) PCT No.: PCT/EP2018/056603
§ 371 (c)(1),
(2) Date: Sep. 12, 2019

(87) PCT Pub. No.: WO2018/167242
PCT Pub. Date: Sep. 20, 2018

(65) Prior Publication Data
US 2020/0303622 A1    Sep. 24, 2020

(30) Foreign Application Priority Data
Mar. 15, 2017   (DE) ...................... 10 2017 105 531.2

(51) Int. Cl.
*H01L 41/20*    (2006.01)
*H01L 41/12*    (2006.01)
(Continued)

(52) U.S. Cl.
CPC .............. *H01L 41/20* (2013.01); *H01L 41/06* (2013.01); *H01L 41/12* (2013.01); *H02N 2/02* (2013.01)

(58) Field of Classification Search
CPC ......... H01L 41/06; H01L 41/12; H01L 41/20; H02N 2/02
(Continued)

(56) References Cited

U.S. PATENT DOCUMENTS

| 5,127,585 A | 7/1992 | Mesenich | |
| 6,229,675 B1 * | 5/2001 | Tanaka | H01F 5/02 360/265 |

(Continued)

FOREIGN PATENT DOCUMENTS

| DE | 1986079 U | 5/1968 |
| DE | 7126814 U | 3/1972 |

(Continued)

*Primary Examiner* — Shawki S Ismail
*Assistant Examiner* — Monica Mata
(74) *Attorney, Agent, or Firm* — Posz Law Group, PLC

(57) ABSTRACT

An actuator device includes at least one actuator element, which consists at least partially of a magnetically shape-shiftable material and which is configured at least for the purpose of causing a movement of at least one actuation element in at least one direction of movement by means of a contraction, and having a magnetic contraction unit, which is configured for the purpose of supplying a magnetic field acting upon the actuator element in order to generate a contraction of the actuator element. In the region of the actuator element, field lines of the magnetic field are aligned at least substantially parallel to the direction of movement.

18 Claims, 5 Drawing Sheets

(51) Int. Cl.
*H01L 41/06* (2006.01)
*H02N 2/02* (2006.01)

(58) Field of Classification Search
USPC .......................................................... 310/26
See application file for complete search history.

(56) References Cited

U.S. PATENT DOCUMENTS

| | | | |
|---|---|---|---|
| 6,246,132 | B1 | 6/2001 | Joshi et al. |
| 7,569,952 | B1 * | 8/2009 | Bono ..................... H02K 35/02 |
| | | | 310/15 |
| 8,901,786 | B2 * | 12/2014 | Laufenberg ............. H01L 41/12 |
| | | | 310/15 |
| 2009/0033448 | A1 | 2/2009 | Hoang et al. |
| 2010/0253750 | A1 * | 10/2010 | Sumi ................... H01L 41/1876 |
| | | | 310/330 |
| 2013/0002057 | A1 | 1/2013 | Laufenberg et al. |
| 2013/0038414 | A1 | 2/2013 | Laufenberg et al. |
| 2015/0207059 | A1 | 7/2015 | Laufenberg et al. |
| 2016/0016169 | A1 * | 1/2016 | Ben-Yakar ........ B01L 3/502738 |
| | | | 506/40 |
| 2016/0148736 | A1 | 5/2016 | Schiepp et al. |
| 2016/0233408 | A1 | 8/2016 | Schiepp et al. |

FOREIGN PATENT DOCUMENTS

| | | |
|---|---|---|
| DE | 102005038891 A1 | 2/2007 |
| DE | 102010010801 A1 | 9/2011 |
| DE | 102011052528 B3 | 2/2013 |
| DE | 102012108568 A1 | 3/2014 |
| DE | 102013110253 A1 | 3/2015 |
| DE | 102014104327 A1 | 10/2015 |
| DE | 102015113244 A1 | 2/2016 |
| GB | 1410008 | 10/1975 |
| JP | H05-130786 A | 5/1993 |
| JP | 2006-186659 A | 7/2006 |
| WO | 98/21762 | 5/1998 |
| WO | 99/45631 A2 | 9/1999 |
| WO | 2005/098985 A1 | 10/2005 |
| WO | 2008/061166 A2 | 5/2008 |
| WO | WO-2015168793 A2 * | 11/2015 ........... F16H 49/001 |

\* cited by examiner

ACTUATOR DEVICE AND METHOD FOR OPERATING AN ACTUATOR DEVICE

CROSS REFERENCE TO RELATED APPLICATIONS

This application is a U.S. national stage application of PCT/EP2018/056603 filed on Mar. 15, 2018, which is based on German Patent Application No. 10 2017 105 531.2 filed on Mar. 15, 2017, the contents of which are incorporated herein by reference.

PRIOR ART

The invention starts from an actuator device in accordance with the preamble of claim 1 and from a method for operating an actuator device in accordance with the preamble of claim 9.

DE 10 2005 038 891 A1 discloses an actuator device, in particular for an injection device in the automotive industry, which has an actuator element consisting of a magnetically changeable material and a magnet unit for influencing the actuator element. In this case, however, the actuator element is formed from a material in which a magnetic field aligned parallel to the direction of movement of an actuation element leads to an expansion of the actuator element, while a magnetic field aligned perpendicularly to the direction of movement leads to a contraction of the actuator element. However, such an embodiment requires relatively high magnetic switching fields and limits a maximum stroke motion that can be achieved by means of the actuator element.

The object of the invention is, in particular, to provide a device of the type in question with improved properties in respect of efficiency. The object is achieved by the characterizing features of claims 1 and 9, while advantageous embodiments and developments of the invention can be found in the dependent claims.

Advantages of the Invention

The invention starts from an actuator device having at least one actuator element, which consists at least partially, preferably in large part and particularly preferably completely, of a magnetically shape-shiftable material and which is configured at least for the purpose of causing a movement of at least one, advantageously precisely one, actuation element in at least one direction of movement by means of a contraction, and having a magnetic contraction unit, which is configured for the purpose of supplying a magnetic field acting, in particular directly, upon the actuator element in order to generate a contraction, advantageously a repeated and magnetically caused contraction, of the actuator element.

It is proposed that, in the region of the actuator element, field lines of the magnetic field, which, in particular, causes a contraction of the actuator element, are aligned at least substantially parallel to the direction of movement. By means of this embodiment, it is possible to provide an actuator device with improved properties in respect of efficiency, in particular energy efficiency, power efficiency, installation space efficiency, switching efficiency and/or cost efficiency. In particular, it is possible here to achieve a particularly weak magnetic switching field and, at the same time, an advantageously large stroke. Moreover, it is advantageously possible to increase a switching speed. Furthermore, a particularly compact actuator device can be provided.

In this context, an "actuator device" should be taken to mean, in particular, at least one part, in particular a subassembly, of an actuator. The actuator device and/or the actuator is advantageously configured at least for use in a valve, in particular a pneumatic valve and preferably an in-line valve, and/or in a valve system having a valve block and a plurality of valves arranged in the valve block, in particular pneumatic valves and preferably in-line valves, e.g. for use in sorting systems, in particular seed sorting systems and/or rice sorting systems. As an alternative or in addition, the actuator device and/or the actuator can also be configured for use in a fluid pump and/or a switch, in particular a fast-acting switch, e.g. a circuit breaker and/or a changeover switch. In particular, it is also possible here for the actuator device to comprise the actuation element, e.g. an actuating body, a closure body, a valve needle and/or a valve tappet, and/or an actuator housing, advantageously an actuator housing designed as an outer housing, in particular at least for accommodating the actuator element, the contraction unit and/or the actuation element. "Configured" is, in particular, to mean specifically designed and/or equipped. That an object is configured for a particular function should be taken to mean, in particular, that the object performs and/or carries out this particular function in at least one state of use and/or operating state. The expression "at least in large part" should here be taken to mean, in particular, at least 55%, advantageously at least 65%, preferably at least 75%, particularly preferably at least 85% and particularly advantageously at least 95%.

Furthermore, an "actuator element" should be taken to mean, in particular, an element, in particular an element in operative connection with the actuation element, which is configured, in particular, for the purpose of converting an external stimulus, e.g. an electric signal, a thermal signal, a mechanical signal and/or advantageously at least one magnetic signal, into a movement. In particular, the actuator element is designed to be at least partially changeable in form and, in particular, is configured for the purpose of changing a shape in accordance with the external stimulus. During this process, a volume of the actuator element is preferably constant. In the present case, the actuator element is configured at least for the purpose of converting a magnetic signal of the contraction unit into a contraction movement and thereby, in particular, of causing a movement of the actuation element in the direction of movement, preferably in such a way that the actuation element moves into an open position. Moreover, the actuator element is advantageously of elongate design and, in particular, defines a longitudinal direction of extent in this case. Here, the actuator element is preferably configured for contraction in the longitudinal direction of extent of the actuator element. The longitudinal direction of extent of the actuator element is preferably at least substantially parallel to the direction of movement. It is particularly advantageous if the actuator element is configured for the purpose of causing a movement of the actuation element in the direction of movement by means of a contraction in the longitudinal direction of extent of the actuator element. It is advantageous for this purpose if the actuator element, in particular an axial end and/or an end face of the actuator element, makes contact with the actuation element indirectly and/or preferably directly. Furthermore, it is particularly advantageous if the actuator element is of integral design. An "object of elongate design" should be taken to mean, in particular, an object wherein a smallest cuboid, in particular imaginary cuboid, that still just surrounds the object has at least one edge and/or side, in particular longest edge and/or side, which is larger by at least 10%, advantageously by at least 25% and particularly preferably by at least 50%, than at least one other edge and/or side of the cuboid, in particular the second-longest edge and/or side thereof. A "longitudinal direction of extent" of an object, in particular an elongate object, should be taken to mean, in particular, a direction of a maximum extent of the object. Furthermore, "at least substantially parallel" should be taken to mean, in particular, an orientation of a direction relative to a reference direction, in particular in a plane, wherein the direction has a deviation of, in particular, less than 8°, advantageously less than 5° and particularly advantageously less than 2° with respect to the reference direction. In this context, "integrally" should be taken to mean, in particular, at least materially connected and/or formed jointly. The material connection can be produced by an adhesive bonding process, a molding process, a welding process, a brazing process and/or some other process, for example. However, integrally should advantageously be taken to mean formed from one piece and/or in one piece. Furthermore, a "magnetically shape-shiftable material" should be taken to mean, in particular, a material that can be influenced by means of a magnetic field, in particular an external magnetic field, and, in at least one operating state, is advantageously configured for the purpose of changing a material property and/or a shape, at least in a manner dependent on the magnetic field.

Furthermore, a "contraction unit" should be taken to mean, in particular, a magnetic unit, advantageously a magnetic unit that surrounds the actuator element at least partially and preferably at least in large part, advantageously a coil unit, in particular having at least one magnet element, which is configured for the purpose of supplying and/or generating a magnetic field, in particular a magnetic field acting on the actuator element, in at least one operating state and thereby influencing and/or causing, in particular, a deformation, in particular at least a contraction, of the actuator element. In this context, the statement that an object "influences" another object should be taken to mean, in particular, that the other object has and/or adopts a different state, a different shape and/or a different position in the case of the absence and/or inactivity of the object than in the case of the presence and/or activity of the object. The contraction unit is preferably configured for the purpose of causing a contraction of the actuator element in the direction of longitudinal extent of the actuator element. The contraction unit is advantageously configured for the purpose of supplying a magnetic field acting upon the actuator element in order to generate a contraction of the actuator element in the direction of longitudinal extent of the actuator element, the field lines of said magnetic field being aligned at least substantially parallel to the direction of longitudinal extent of the actuator element. As a particular preference, the contraction unit is configured for the purpose of causing a contraction of the actuator element in at least one state of use, in particular by means of the magnetic field, and thereby producing a movement of the actuation element in the direction of movement, preferably into the open position. Moreover, it is advantageous if the contraction unit is arranged at least in large part in the vicinity of the actuator element. The "vicinity" should be taken to mean, in particular, any spatial region which is formed from points which are at less than one third, preferably less than one fourth, preferably less than one sixth and particularly preferably less than one tenth of a minimum longitudinal extent of the actuator element from a reference point and/or a reference component, in particular the actuator element, and/or which are in each case at a distance of at most 20 mm, preferably at most 10 mm and particularly preferably at most 5 mm from a reference point and/or a reference component, in particular the actuator element. Furthermore, a "coil unit" should be taken to mean, in particular, a unit having at least one coil and/or a plurality of interconnected coils. Moreover, "a region of an object" should be taken to mean, in particular, a volume of a smallest imaginary cuboid that still just completely surrounds the object.

The actuator element is configured at least for the purpose of transmitting a tensile force to the actuation element, thereby, in particular, making it possible to achieve an advantageous switching effect. In particular, the actuator element is here configured at least for the purpose of causing a pulling movement of the actuation element in the direction of movement by means of a contraction. For this purpose, the actuator element, advantageously a first axial end, facing the actuation element, and/or an end face, facing the actuation element, of the actuator element, is, in particular, connected to the actuation element, in particular indirectly and/or directly and preferably for conjoint movement. Moreover, the actuator element, advantageously a second axial end, remote from the actuation element, and/or a second end face, remote from the actuation element, of the actuator element, is arranged immovably and/or in a fixed manner, in particular relative to the actuator housing, and is advantageously fixed on the actuator housing. Here, the expression "for conjoint movement" should be taken to mean, in particular, that a movement of the actuator element leads to a simultaneous and advantageously uniform movement of the actuation element. As an alternative or in addition, however, it would also be possible for the actuator element to be configured for the purpose of transmitting a pressure force to the actuation element.

The magnetically shape-shiftable material could correspond to a magnetostrictive material, for example. However, it is advantageous if the magnetically shape-shiftable material is a magnetically acting and/or active shape-memory material, in particular a magnetic shape-memory material, and, as a particular preference, a magnetic shape-memory alloy (also known as an MSM material=magnetic shape memory). In this case, the magnetically shape-shiftable material preferably contains nickel, manganese and gallium. It is thereby possible, in particular, to achieve particularly simple deformation with an advantageously large distance of movement.

It is furthermore proposed that the magnetically shape-shiftable material is of monocrystalline configuration. It is thereby possible, in particular, to enhance the capacity of the material to bear mechanical loads and/or to achieve an advantageously large stroke action.

A particularly small magnetic switching field and/or advantageously large stroke can be achieved, in particular, if the magnetically shape-shiftable material has a tetragonal crystal structure with the lattice constants a, b=a and c, wherein c/a<1, and the magnetically shape-shiftable material has a magnetic anisotropy, wherein the magnetic permeability is greater in the direction of the c-axis than along the a-axis and b-axis. In this case, the magnetically shape-shiftable material is, in particular, easier to magnetize along the c-axis, which is, in particular, the short axis. Moreover, in this case, the c-axis, in particular, rotates in the direction of the field lines of the magnetic field when a magnetic field is applied, and this leads to a contraction and/or shortening of the actuator element particularly in the case of the magnetic field caused by the contraction unit.

The magnetic field, in particular the contraction unit, preferably causes a change in the length of the actuator element in the direction of movement of at least 2%, preferably of at least 5% and particularly preferably of at least 7%, thereby making it possible to achieve a particularly advantageous switching behavior with clearly defined operating positions. In particular, a longitudinal extent of the actuator element can vary between a basic form and a contracted form, in particular a small as possible contracted form, in this case by at least 3%, preferably by at least 5% and particularly preferably by at least 7%.

It is furthermore proposed that the actuator element is connected rigidly to the actuation element, in particular materially, preferably by means of a welded joint and/or an adhesive joint, or nonpositively and/or positively, preferably by means of a clamped joint. It is thereby possible, in particular, to provide an advantageous connection between the actuator element and the actuation element.

In another embodiment of the invention, it is proposed that the contraction unit for supplying the magnetic field comprises at least one, preferably precisely one, magnet element designed as an air-core coil. In this case, the magnet element preferably surrounds the actuator element at least partially and preferably at least in large part. In particular, it is also possible here for the contraction unit to be designed as an air-core coil. In this context, an "air-core coil" should be taken to mean, in particular, an inductive component, in particular a coil, which does not have a magnetic core. It is thereby possible, in particular, to reduce an inductance of the contraction unit, thereby, in particular, making it possible to provide an actuator device which switches particularly quickly.

It is furthermore proposed that the contraction unit for supplying the magnetic field comprises at least one, preferably precisely one, magnet element designed as a ribbon coil. In this case, the magnet element preferably surrounds the actuator element at least partially and preferably at least in large part. In particular, it is also possible here for the contraction unit to be designed as a ribbon coil. In this context, a "ribbon coil" should be taken to mean, in particular, an inductive component, in particular a coil which consists, in particular, of at least one electric conductor, preferably with a cross section of elongate design and, in particular, a rectangular cross section, and which, in particular, has at least one turn and advantageously a plurality of turns. As a particular preference, the ribbon coil in this case consists at least in large part of a wound metal sheet and/or a plurality of wound metal sheets. It is thereby possible, in particular, to provide an advantageously uniform magnetic field.

In another embodiment of the invention, it is proposed that the contraction unit for supplying the magnetic field comprises at least one, preferably precisely one, magnet element consisting of stacked and preferably joined disk springs. In this case, the disk springs can advantageously be of slotted design and particularly advantageously can be connected integrally to one another. In this case, the magnet element preferably surrounds the actuator element at least partially and preferably at least in large part. In particular, it is possible here for the contraction unit also to be formed from stacked and preferably joined disk springs. It is thereby possible, in particular, to provide a magnet element which has advantageously resilient and/or restoring properties.

As an alternative or in addition, it is proposed that the contraction unit for supplying the magnetic field comprises at least one, advantageously precisely one, magnet element designed as a spiral coil and/or at least one, advantageously precisely one, magnet element designed as a permanent magnet, which, in particular, can be mounted so as to be movable relative to the actuator element. It is thereby possible, in particular, to achieve an advantageous flexibility. Moreover, it is possible, in particular, to make optimum use of an available and/or required installation space.

If the contraction unit has an inductance of at most 10 mH, preferably at most 100 µH, and particularly preferably at most 100 nH, it is advantageously possible, in particular, to reduce a switching time of the actuator device.

It is furthermore proposed that the contraction unit has at least one flux concentrator, which is configured for the purpose of intensifying the magnetic field, in particular that of the contraction unit, acting on the actuator element. It is thereby possible, in particular, to intensify a magnetic field acting on the actuator element, thereby advantageously making it possible to reduce an inductance and/or impedance of the contraction unit.

The flux concentrator is advantageously arranged in an axial end region of the actuator element, in particular in the vicinity of an axial end of the actuator element, thereby making it possible, in particular, to optimize a mode of action of the flux concentrator. It is advantageous here if the flux concentrator is arranged in the vicinity of the first axial end of the actuator element and/or the first end face of the actuator element and, particularly preferably, at least partially between the actuator element and the actuation element. As a particularly advantageous possibility, the contraction unit can also have at least two, in particular separate, flux concentrators, which are advantageously arranged in opposite axial end regions of the actuator element.

In another embodiment of the invention, it is proposed that the actuator device has an expansion unit, which is configured for an expansion, in particular indirect and/or direct and preferably repeated expansion, of the actuator element, in particular in a direction opposite to a contraction movement of the actuator element and preferably in the direction of longitudinal extent of the actuator element. In this context, an "expansion unit" should be taken to mean, in particular, a mechanical and/or magnetic unit, advantageously a unit that surrounds the actuator element at least partially and preferably at least in large part, in particular having at least one expansion element, which is configured for the purpose of influencing and/or causing a deformation, in particular at least an expansion, of the actuator element in at least one operating state. In particular, the expansion unit is configured for the purpose of preloading and/or resetting the actuator element. The expansion unit is preferably configured for the purpose of causing an expansion of the actuator element in the direction of longitudinal extent of the actuator element. As a particular preference, the expansion unit is configured for the purpose of causing an expansion of the actuator element and/or a movement of the actuation element in another direction of movement opposite to said direction of movement, preferably into a closed position, in at least one state of use. It is advantageous here if the expansion unit and/or the actuator element are/is configured at least for the purpose of transmitting a pressure force to the actuation element, preferably in such a way that the actuation element moves in the other direction of movement and/or is held in the closed position. In particular, a force exerted by the expansion unit on the actuator element and/or the actuation element is less than a force exerted by the contraction unit on the actuator element, with the result that actuation and/or activity of the contraction unit leads to a movement of the actuation element in the direction of movement. Moreover, it is advantageous if the expansion unit is arranged at least in large part in the vicinity of the actuator element. Moreover, the expansion unit can preferably be formed at least in part integrally with the contraction unit. In this context, the statement that an object is "formed at least in part integrally" with another object should be taken to mean, in particular, that the objects have at least one common component and/or at least one component of the object and/or the object are/is connected and/or formed integrally with at least one component of the other object and/or with the other object. However, it is preferable if all the components of the object are formed integrally with at least one component of the other object. It is thereby possible, in particular, to provide an actuator device which switches repeatedly and/or repeatably.

It is furthermore proposed that the expansion unit comprises at least one, advantageously precisely one, expansion element designed as an elastic element, in particular a spring element and preferably a compression spring and/or a spiral spring, which, in particular, is connected operatively to the actuation element. In this case, the expansion element could be connected to the actuator element, for example, and, in particular, could cause a direct expansion of the actuator element. As a particular preference, however, the expansion unit is in this case configured for the purpose of causing a movement of the actuation element in the other direction of movement, preferably into the closed position, in at least one state of use, and thereby causing an expansion of the actuator element, which is, in particular, connected for conjoint movement to the actuation element. It is advantageous if, for this purpose, the expansion element makes contact with the actuation element directly and, in particular, causes a movement of the actuation element in the other direction of movement, in particular into the closed position. It is thereby possible, in particular, to provide an actuator device which switches particularly quickly. Moreover, an actuator device which is almost neutral in terms of installation space can be achieved in the case of integral formation of the contraction unit with the expansion unit.

As an alternative or in addition, it is proposed that the expansion unit comprises at least one, advantageously precisely one, expansion element designed as a permanent magnet, which, in particular, is connected operatively to the actuator element. In this case, the expansion element is, in particular, configured for the purpose of supplying a magnetic field acting upon the actuator element in order to generate an expansion of the actuator element, the field lines of which magnetic field are aligned at least substantially perpendicularly to the direction of movement of the actuation element and/or to the longitudinal direction of extent of the actuator element. As a particular preference, the expansion unit is in this case configured for the purpose of causing an expansion of the actuator element in at least one state of use, by means of the further magnetic field, and thereby producing a movement of the actuation element in the other direction of movement, preferably into the closed position. In this case, the actuator element is thus configured at least for the purpose of converting a magnetic signal of the expansion unit into an expansion movement and thereby, in particular, of causing a movement of the actuation element in the other direction of movement, preferably in such a way that the actuation element moves into the closed position. In this context, the expression "at least substantially perpendicular" should be taken to mean, in particular, an orientation of a direction relative to a reference direction, wherein the direction and the reference direction, in particular when considered in a plane, enclose an angle of, in particular, between 82° and 98°, advantageously between 85° and 95° and particularly preferably between 88° and 92°. It is thereby possible, in particular, to provide an advantageously robust actuator device, wherein a service life and/or endurance can advantageously be enhanced.

According to another embodiment of the invention, it is proposed that the actuator device has a detection unit, which is configured for the purpose of a detection of at least one actuation parameter correlated with the movement of the actuation element, whereby, in particular, advantageous detection and/or recording of a switching process can be achieved. To detect the actuation parameter, it would be possible, for example, for the detection unit to have at least one sensor designed as a camera, in particular a CCD camera, at least one sensor designed as an acceleration sensor, and/or at least one sensor designed as a magnetic field sensor, e.g. a sensor based on the anisotropy magnetoresistive effect, in particular an AMR sensor, a sensor based on the giant magnetoresistive effect, in particular a GMR sensor, and/or a Hall effect sensor. However, detection which is advantageously low-cost and/or optimized in respect of installation space can be achieved, in particular, if the detection unit for detecting the actuation parameter has at least one sensor designed as a sensor coil. An "actuation parameter" should be taken to mean, in particular, a parameter which is correlated, in particular, with the movement of the actuation element and advantageously with a deformation of the actuator element. At least on the basis of the actuation parameter, the detection unit and/or a further unit, advantageously the actuator device, can preferably infer a movement of the actuation element and/or determine a movement of the actuation element. Here, the detection unit is advantageously configured for the purpose of a detection of a deformation of the actuator element, in particular directly and/or indirectly. The actuation parameter could, for example, correspond to a position, in particular to a relative and/or an absolute position, of the actuation element. However, the proposal is preferably that the actuation parameter is an induction voltage caused by a deformation of the actuator element and/or an induction current caused by a deformation of the actuator element, thereby making it possible, in particular, to provide an advantageously simple and/or low-cost detection unit.

Furthermore, the invention relates to a valve system having a valve block and a plurality of valves arranged in the valve block, in particular in recesses in the valve block, the valves, in particular pneumatic valves and preferably in-line valves, advantageously being aligned parallel to one another, which valves each have at least one actuator having the abovementioned actuator device, wherein the valves, in particular adjacent valves, have a minimum distance, in particular a grid dimension, of at most 10 mm, preferably of at most 8.5 mm and particularly preferably of at most 7 mm. It is thereby possible, in particular, to improve efficiency, in particular energy efficiency, power efficiency, installation space efficiency, switching efficiency and/or cost efficiency. In particular, it is possible here to achieve a particularly weak magnetic switching field and, at the same time, an advantageously large stroke. Moreover, it is advantageously possible to increase a switching speed. Furthermore, it is possible to provide a valve system with an advantageously small grid dimension, thereby, in particular, allowing use in sorting systems and enabling an improved sorting function to be achieved.

Moreover, the invention starts from a method for operating an actuator device which has at least one actuator element that consists at least partially, preferably at least in large part and particularly preferably completely, of a magnetically shape-shiftable material, wherein the actuator element is contracted by means of a magnetic field acting on the actuator element, in particular directly, and a movement of at least one, advantageously precisely one, actuation element in at least one direction of movement is caused by means of the contraction.

It is proposed that, in the region of the actuator element, field lines of the magnetic field, which, in particular, causes a contraction of the actuator element, are aligned at least substantially parallel to the direction of movement. It is thereby possible, in particular, to improve efficiency, in particular energy efficiency, power efficiency, installation space efficiency, switching efficiency and/or cost efficiency. In particular, it is possible here to achieve a particularly weak magnetic switching field and, at the same time, an advantageously large stroke. Moreover, it is advantageously possible to increase a switching speed. Furthermore, a particularly compact actuator device can be provided.

There is no intention to restrict the actuator device and the method for operating the actuator device to the use and embodiment described above. In order to implement a mode of operation described herein, it is possible, in particular, for the actuator device and the method for operating the actuator device to have a number of individual elements, components and units which deviates from a number stated herein.

DRAWINGS

Further advantages will become apparent from the following description of the drawing. The drawings illustrate illustrative embodiments of the invention. The drawings, the description and the claims contain numerous features in combination. A person skilled in the art will also expediently consider the features individually and combine them into worthwhile further combinations.

Figure 3:
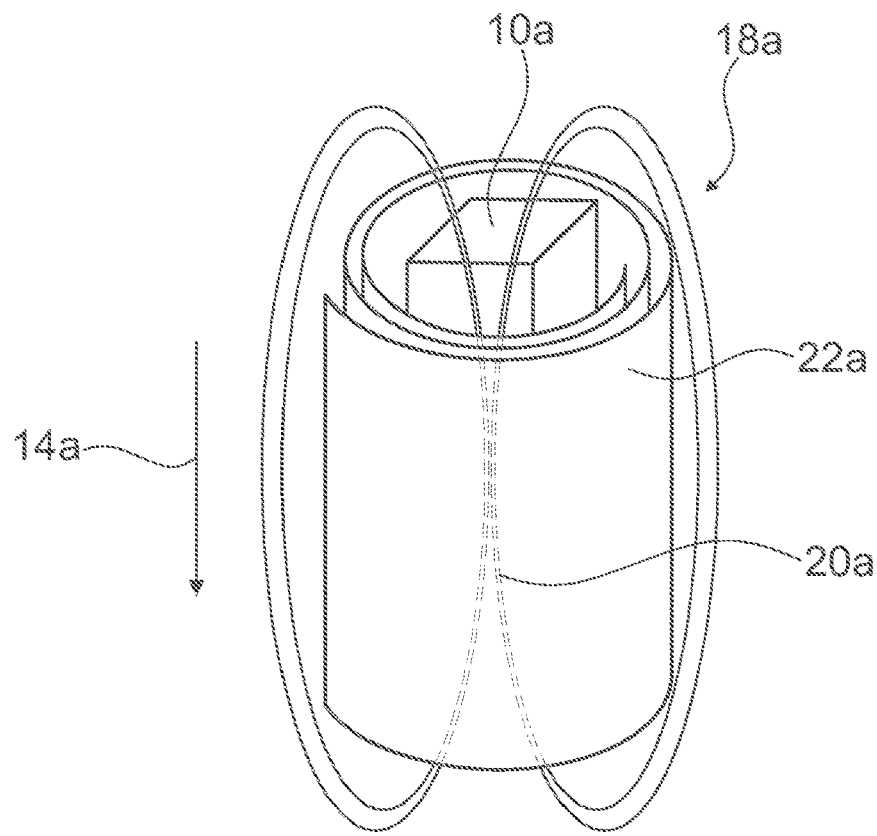
Figure 4:
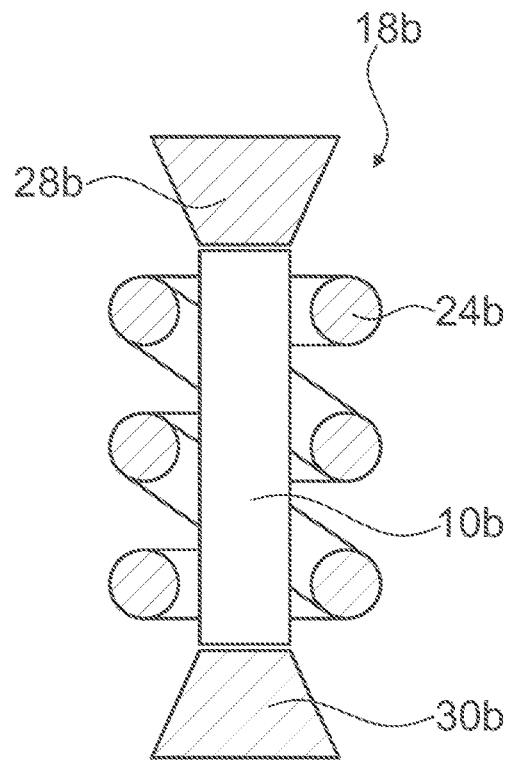
Figure 5:
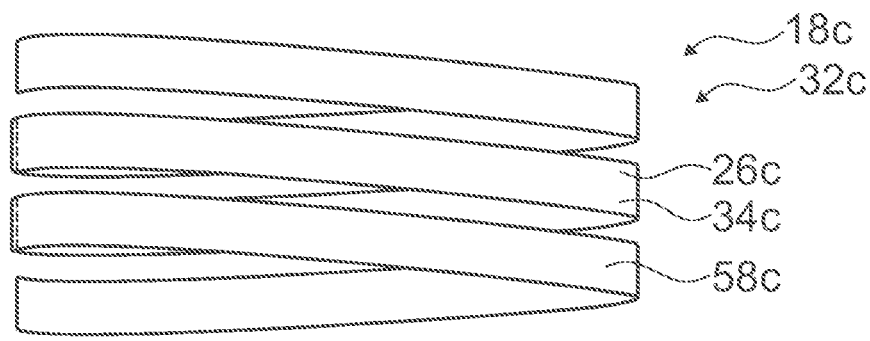
Figure 6A:
Figure 6B:
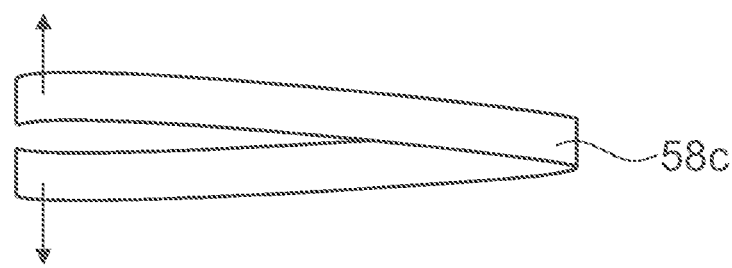
Figure 7:
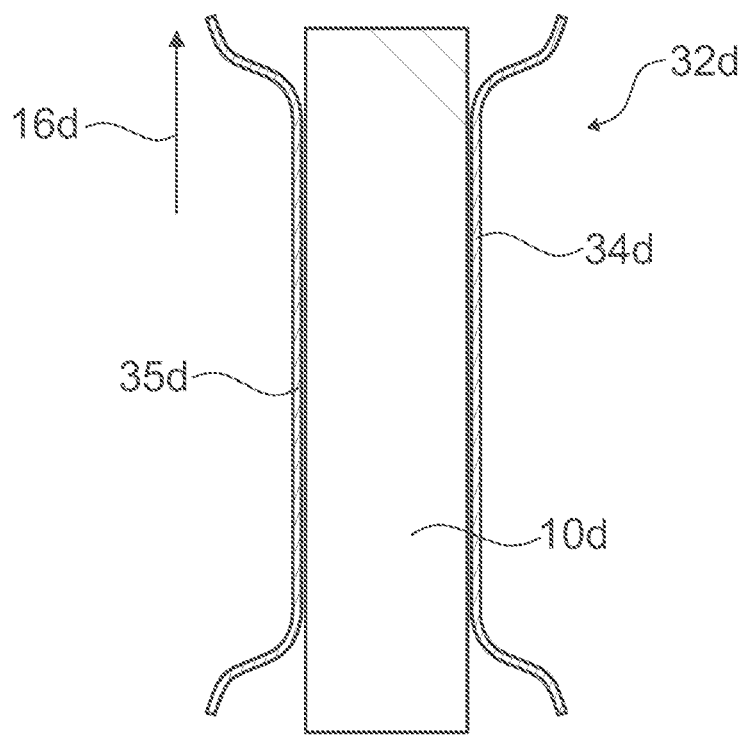
Figure 8:
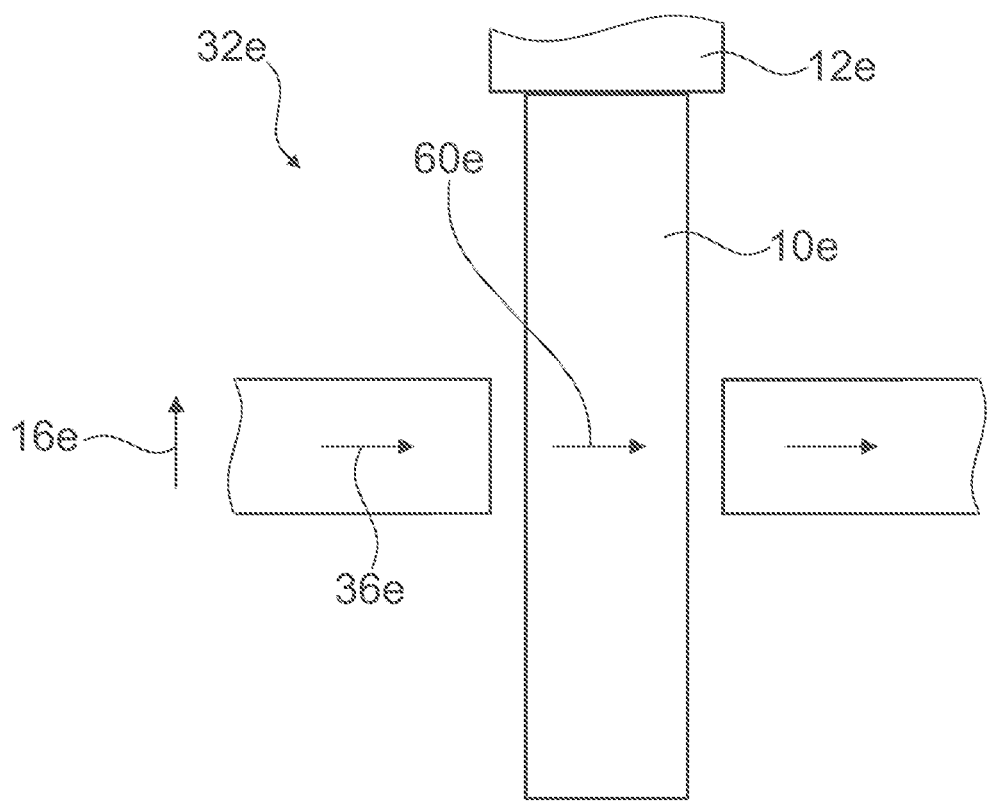
Figure 9:
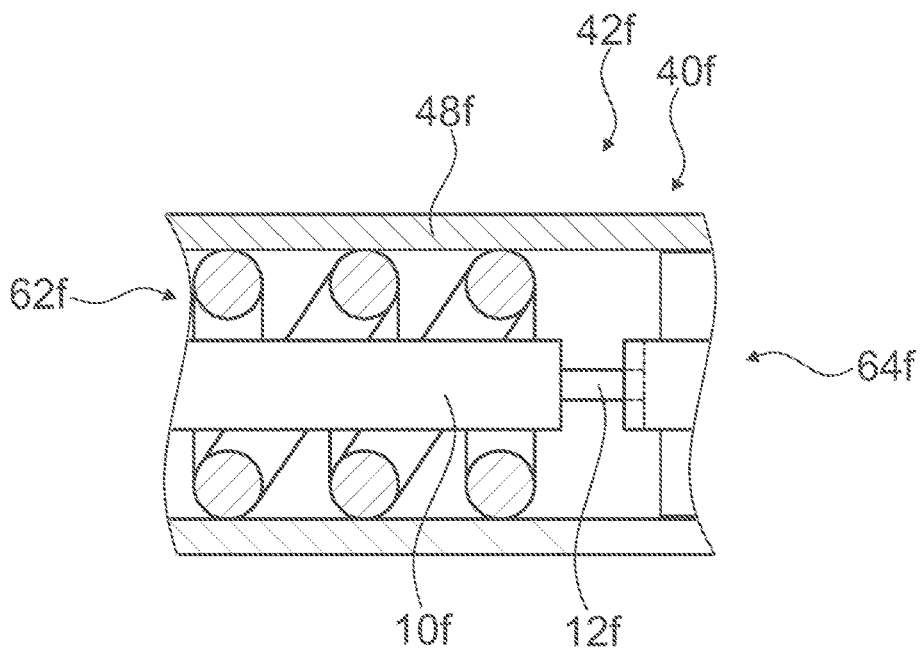
Figure 10:
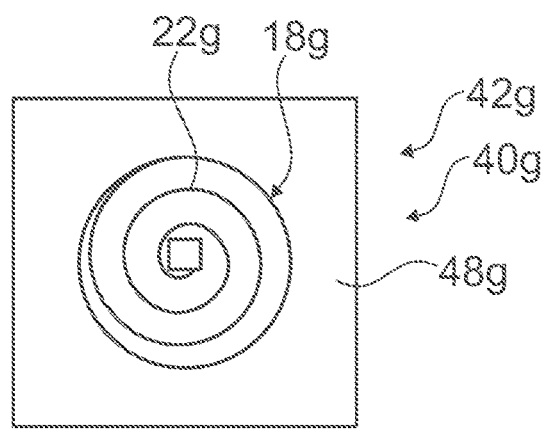
Figure 11:
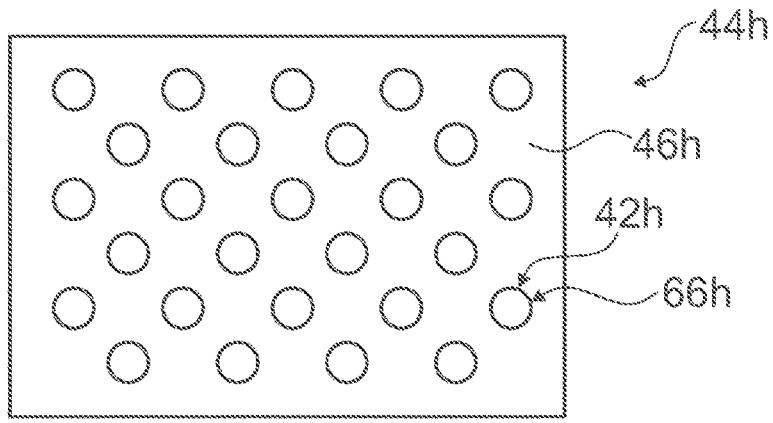

FIG. 3 shows an actuator element of the actuator device and a contraction unit of the actuator device in a detail illustration, FIG. 4 shows another illustrative embodiment of an actuator device having an actuator element and a contraction unit, FIG. 5 shows another illustrative embodiment of an actuator device having a contraction unit, which comprises a magnet element consisting of stacked disk springs, FIGS. 6a-b show one of the disk springs of the magnet element from FIG. 5, FIG. 7 shows another illustrative embodiment of an actuator device having an actuator element and an expansion unit, FIG. 8 shows another illustrative embodiment of an actuator device having an actuator element and an expansion unit, FIG. 9 shows a valve having another actuator device in a schematic side view, FIG. 10 shows another illustrative embodiment of a valve having another actuator device in a front view, and FIG. 11 shows a valve system having a plurality of actuator devices in a schematic view.

DESCRIPTION OF THE ILLUSTRATIVE EMBODIMENTS

Figure 1:
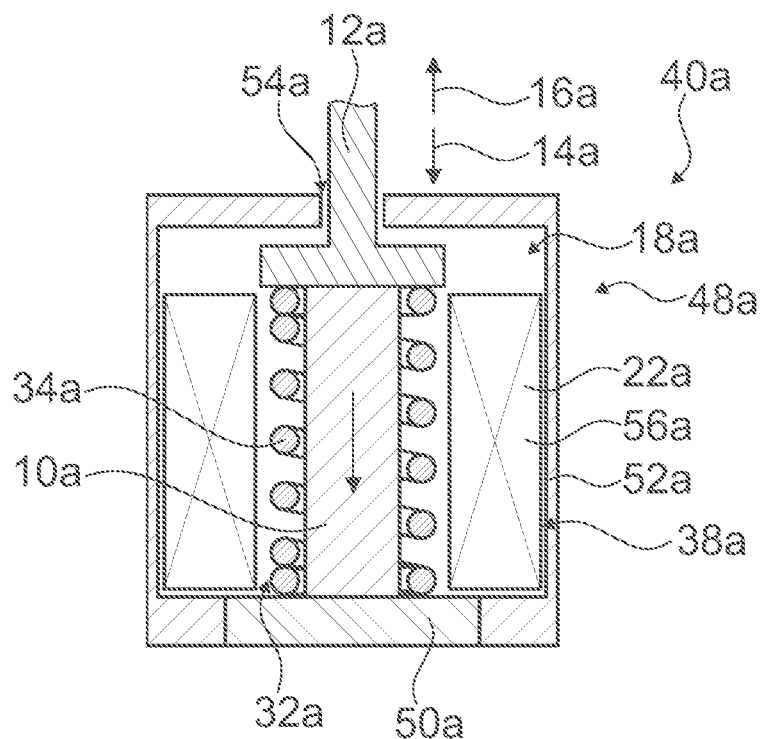
FIG. 1 shows an actuator having an actuator device in a schematic side view.
Figure 2:
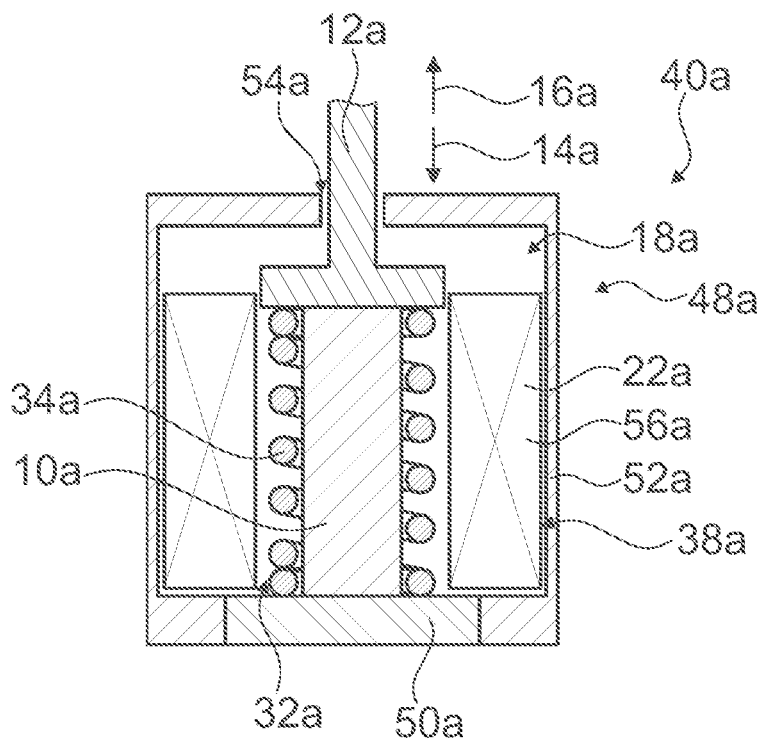
FIG. 2 shows the actuator having the actuator device in an operating state.

FIGS. 1 and 2 show an illustrative actuator 40a having an actuator device in a schematic view.

The actuator device comprises an actuator housing 48a. The actuator housing 48a is designed as an outer housing. In the present case, by way of example, the actuator housing 48a is of cylindrical, in particular circular-cylindrical, design. The actuator housing 48a is of at least substantially closed design. The actuator housing 48a is designed as a receiving unit and, in particular, is configured for the purpose of accommodating and/or supporting at least a large part of the components required for operation of the actuator 40a.

In the present case, the actuator housing 48a is of at least two-part design. In this case, the actuator housing 48a has at least two housing parts 50a, 52a, which are, in particular, separate and can be connected to one another by means of a press-fit joint. Here, a first housing part 50a of the housing parts 50a, 52a is designed as a base element. The first housing part 50a at least in large part defines a first end side of the actuator housing 48a, which is, in particular, cylindrical. A second housing part 52a of the housing parts 50a, 52a is designed as a cover element. The second housing part 52a defines a second end side and a lateral surface of the actuator housing 48a, which is, in particular, cylindrical. Moreover, the second housing part 52a at least partially defines the first end side of the actuator housing 48a, which is, in particular, cylindrical. As an alternative, it is conceivable to design an actuator housing of cuboidal and/or cube shape. Moreover, it would also be possible for an actuator housing to be of integral design. It is furthermore conceivable in principle to dispense with an actuator housing.

The actuator housing 48a furthermore has at least one pass-through opening 54a. In this case, the pass-through opening 54a is arranged on a side opposite the first housing part 50a and/or in the region of the second end side of the actuator housing 48a, which is, in particular, cylindrical. The pass-through opening 54a is arranged in a central region of the second end side of the actuator housing 48a.

Moreover, the actuator device comprises at least one actuation element 12a. In the present case, the actuator device comprises precisely one actuation element 12a. The actuation element 12a is designed as an actuating body. The actuation element 12a is arranged at least partially within the actuator housing 48a. The actuation element 12a is arranged centrally within the actuator housing 48a. The actuation element 12a is associated with the pass-through opening 54a. The actuation element 12a is passed at least partially out of the actuator housing 48a through the pass-through opening 54a. A section of the actuation element 12a which is passed out of the actuator housing 48a defines an actuating section of the actuation element 12a. In this arrangement, the actuation element 12a is mounted movably relative to the actuator housing 48a. The actuation element 12a can be moved in a direction of movement 14a and in another direction of movement 16a, which is opposed to the direction of movement 14a. Here, the direction of movement 14a is oriented in a straight line from the pass-through opening 54a in the direction of the first housing part 50a, while the other direction of movement 16a is oriented in a straight line from the first housing part 50a in the direction of the pass-through opening 54a. As an alternative, however, an actuator device can also have a different number of actuation elements, e.g. at least two actuation elements. Moreover, it would also be possible for an actuation element to be designed as a closure body, valve needle or valve tappet or the like.

Furthermore, the actuator device has at least one actuator element 10a. In the present case, the actuator device comprises precisely one actuator element 10a. In principle, however, an actuator device could also have a different number of actuator elements, e.g. at least two actuator elements and/or at least three actuator elements.

The actuator element 10a is arranged completely within the actuator housing 48a. The actuator element 10a is arranged centrally within the actuator housing 48a. The actuator element 10a is of integral design. The actuator element 10a is designed as a solid body. The actuator element 10a is of at least substantially strip-shaped and/or cuboidal design. The actuator element 10a is of elongate design and has a longitudinal extent, which is arranged vertically in FIGS. 1 and 2, in particular. Here, the longitudinal extent of the actuator element 10a defines a direction of longitudinal extent of the actuator element 10a. In an operating state, the actuator element 10a is arranged in such a way that the direction of longitudinal extent of the actuator element 10a is oriented parallel to the direction of movement 14a and to the other direction of movement 16a.

Moreover, the actuator element 10a is implemented to be shape-shiftable. The actuator element 10a is composed of a magnetically shape-shiftable material. The actuator element 10a is composed of a magnetically shape-shiftable shape-memory material. In the present case, the actuator element 10a is composed of a magnetic shape-memory alloy. The magnetic shape-memory alloy contains nickel, manganese and gallium. The actuator element 10a is composed of a nickel-manganese-gallium alloy. The magnetically shape-shiftable material is of monocrystalline configuration. Thus, in the present case, the actuator element 10a is designed as a single crystal.

Furthermore, the magnetically shape-shiftable material is in a martensitic phase relevant for the MSM effect, in a tetragonal crystal structure. In this case, the magnetically shape-shiftable material has the lattice constants a, b=a and c, where c/a<1. In addition, the magnetically shape-shiftable material has a magnetic anisotropy, wherein the c-axis has a higher magnetic permeability than the a-axis and the b-axis, thereby making the magnetically shape-shiftable material and/or the actuator element 10a more easily magnetizable along the c-axis, which is, in particular, the short axis. When a magnetic field is applied, the c-axis rotates in the direction of the field lines of the magnetic field, and this leads, in particular, to a contraction and/or shortening of the actuator element 10a in the direction of the field lines. In the present case, a magnetic field of this kind causes a change in the length of the actuator element 10a in the longitudinal direction of extent of the actuator element 10a of at least 3%. As an alternative, however, an actuator element could also be composed of an alloy containing nickel, manganese and gallium, an iron-palladium alloy and/or an alloy containing iron and palladium. Moreover it would also be possible for an actuator element to be formed from a foam, as a polycrystalline and/or as a composite structure, wherein, in the latter case, nickel, manganese and gallium components can be embedded in a matrix. In principle, it would furthermore also be possible for an actuator element to be composed of a magnetostrictive material.

The magnetically shape-shiftable shape-memory material which is used is a magnetically active material. This material has the property that a deformation and/or change in shape, in the present case, in particular, a contraction movement in the longitudinal direction of extent of the actuator element 10a in at least one operating state, takes place in response to an applied magnetic field with a defined minimum field strength and a defined direction. However, a movement back into the basic shape and/or initial shape does not automatically take place after a reduction and/or deactivation of the magnetic field. On the contrary, the actuator element 10a remains in the current, in particular expanded and/or contracted, form, even after the reduction and/or deactivation of the magnetic field, in particular at least in a state in which there is no external stimulus acting on the actuator element 10a apart from pure gravity and/or an ambient pressure.

Moreover, the magnetically shape-shiftable shape-memory material has the property that a deformation and/or change in shape, in particular a mechanical deformation and/or change in shape, takes place in response to a mechanical force with a defined minimum intensity and a defined direction. For a deformation and/or change in shape of the actuator element 10a to occur here, an internal force of the actuator element 10a, in the present case, in particular, caused by a relatively high hysteresis of a material used, must be overcome. In this case too, a movement back into a basic shape and/or initial shape does not automatically take place after a reduction and/or interruption of the mechanical force and/or of a mechanical stress. In this case too, therefore, the actuator element 10a would remain in the current form after the reduction and/or interruption of the mechanical force and/or of the mechanical stress, particularly without a restoring external stimulus.

In the present case, the actuator element 10a is thus capable of being influenced and, in particular, deformed at least by means of a magnetic field and/or of a mechanical force.

The actuator element 10a is furthermore associated with the actuation element 12a. The actuator element 10a is operatively connected to the actuation element 12a. In this arrangement, the actuator element 10a is arranged on an opposite side of the actuation element 12a from the actuating portion of the actuation element 12a. The actuator element 10a and the actuation element 12a are arranged directly in series. In the present case, the actuator element 10a supports the actuation element 12a in such a way as to be movable in the direction of movement 14a and the other direction of movement 16a.

For this purpose, the actuator element 10a makes direct contact with the actuation element 12a. In the present case, a first axial end of the actuator element 10a, said end more particularly facing the actuation element 12a, makes contact with the actuation element 12a, in particular the opposite side of the actuation element 12a from the actuating portion. The first axial end of the actuator element 10a defines a movable end of the actuator element 10a. The actuator element 10a is furthermore connected for conjoint movement and, in particular, rigidly connected, to the actuation element 12a, thereby enabling the actuator element 10a to transmit a tensile force to the actuation element 12a.

Moreover, the actuator element 10a makes direct contact with the actuator housing 48a. In the present case, a second axial end of the actuator element 10a, said end more particularly being opposite to the first axial end, makes contact with the first housing part 50a. Here, the second axial end of the actuator element 10a is arranged in a fixed manner relative to the actuator housing 48a and defines an immovable end of the actuator element 10a. In the present case, the second axial end of the actuator element 10a is fixed on the first housing part 15a, e.g. by means of a clamped joint and/or a welded joint.

In the present case, a maximum distance of movement of the actuator element 10a and/or of the actuation element 12a along the direction of movement 14a and the other direction of movement 16a corresponds to at least 3% of a maximum longitudinal extent of the actuator element 10a. Moreover, a maximum distance of movement of the actuator element 10a and/or of the actuation element 12a along the direction of movement 14a and the other direction of movement 16a corresponds to at most 20% of a maximum longitudinal extent of the actuator element 10a. As an alternative, it is conceivable to connect an actuator element to an actuator housing and/or to an actuation element by means of some other joining method, e.g. by means of an adhesive joint or the like. Moreover, it would in principle also be possible for an actuator element to be connected indirectly to an actuation element and/or to an actuator housing. It is furthermore conceivable to dispense with a connection between an actuator element and an actuation element. In this case, an actuator element could merely make contact with an actuation element, in order to transmit pressure forces for example.

In the present case, the actuator element 10a is configured for the purpose of causing a movement of the actuation element 12a in the direction of movement 14a by means of a contraction in the direction of longitudinal extent of the actuator element 10a and, in particular, by means of a tensile force thereby transmitted to the actuation element 12a.

For this purpose, the actuator device comprises a magnetic contraction unit 18a. The contraction unit 18a is arranged within the actuator housing 48a. The contraction unit 18a is arranged in the vicinity of the actuator element 10a. The contraction unit 18a completely surrounds the actuator element 10a. The contraction unit 18a is immovable relative to the actuator element 10a. The contraction unit 18a is actively controllable and is operatively connected to supply electronics (not illustrated) of the actuator device. The contraction unit 18a is configured for the purpose of supplying a magnetic field that acts on the actuator element 10a. The contraction unit 18a is configured for the purpose of influencing a deformation of the actuator element 10a, in particular by means of the magnetic field. In the present case, the contraction unit 18a is configured for the purpose of causing a contraction of the actuator element 10a by means of the magnetic field and thereby producing a movement of the actuation element 12a in the direction of movement 14a. Here, the contraction unit 18a is configured for the purpose of supplying a magnetic field, the field lines 20a of which are aligned at least substantially parallel to the direction of movement 14a in the region of the actuator element 10a (see also FIG. 3).

For this purpose, the contraction unit 18a comprises at least one magnet element 22a. In the present case, the contraction unit 18a comprises precisely one magnet element 22a. The magnet element 22a is designed as a coil unit. The magnet element 22a is designed as a single coil. The magnet element 22a has a coil axis which is aligned parallel to the longitudinal direction of extent of the actuator element 10a. The magnet element 22a has a plurality of turns, in the present case, in particular, between 5 and 25 turns. The magnet element 22a is designed as an air-core coil and thus has no magnetic core. In the present case, the magnet element 22a is furthermore designed as a ribbon coil (see especially FIG. 3). Here, the magnet element 22a consists of a single wound metal sheet. In an operating state, in which the magnet element 22a is energized, the magnet element 22a produces the magnetic field, the field lines 20a of which are aligned at least substantially parallel to the direction of movement 14a in the region of the actuator element 10a, as a result of which the actuator element 10a is contracted (see FIG. 2). As an alternative, a contraction unit could have a plurality of magnet elements. It is furthermore conceivable to design a magnet element as a spiral coil or the like. It is furthermore conceivable to arrange a contraction unit and/or at least one magnet element outside an actuator housing.

Particularly to obtain a repeatedly and/or repeatably switching actuator device, the actuator device furthermore comprises an expansion unit 32a. In the present case, the expansion unit 32a is designed as a mechanical expansion unit. The expansion unit 32a is of passive design and, in particular, does not have any possibility of active control. The expansion unit 32a is arranged within the actuator housing 48a. The expansion unit 32a is arranged in the vicinity of the actuator element 10a. The expansion unit 32a completely surrounds the actuator element 10a. The expansion unit 32a is arranged between the actuator element 10a and the contraction unit 18a. Here, the expansion unit 32a is arranged so as to be concentric with the contraction unit 18a. The expansion unit 32a is configured for the purpose of expanding the actuator element 10a. In the present case, the expansion unit 32a is configured for the purpose of preloading the actuator element 10a, in particular before a contraction of the actuator element 10a by the contraction unit 18a, and/or of resetting the actuator element 10a, in particular after a contraction of the actuator element 10a by the contraction unit 18a. In the present case, the expansion unit 32a is configured for the purpose of causing an expansion of the actuator element 10a in the direction of longitudinal extent of the actuator element 10a.

For this purpose, the expansion unit 32a comprises at least one expansion element 34a. In the present case, the expansion element 32a comprises precisely one expansion element 34a. The expansion element 34a is designed as an elastic element. The expansion element 34a is designed as a spring element, in particular in the present case as a spiral spring and/or compression spring. The expansion element 34a has a central axis which is aligned parallel to the longitudinal direction of extent of the actuator element 10a.

The expansion element 34a is furthermore operatively connected to the actuation element 12a. In the present case, a first axial end of the expansion element 34a makes contact with the actuation element 12a, in particular the opposite side of the actuation element 12a from the actuating portion. Furthermore, a second axial end of the expansion element 34a, said end more particularly being opposite to the first axial end of the expansion element 34a, makes contact with the actuator housing 48a, in particular the first housing part 50a. In this arrangement, the expansion element 34a is clamped between the actuation element 12a and the actuator housing 48a.

The expansion element 34a is configured for the purpose of transmitting a pressure force to the actuation element 12a. In the present case, the expansion element 34a is configured for the purpose of transmitting a pressure force to the actuation element 12a in such a way that the actuation element 12a moves in the other direction of movement 16a, in particular after a contraction of the actuator element 10a by the contraction unit 18a. The expansion element 34a is thus configured for the purpose of causing a movement of the actuation element 12a in the other direction of movement 16a in at least one state of use and thereby causing an expansion, in particular mechanical expansion, of the actuator element 10a, which is, in particular, connected for conjoint movement to the actuation element 12a. Here, a force exerted by the expansion element 34a on the actuation element 12a is less than a force exerted by the contraction unit 18a on the actuator element 10a, with the result that actuation and/or activity of the contraction unit 18a leads to a movement of the actuation element 12a in the direction of movement 14a. However, it would also be possible, as an alternative, for an expansion unit to be of magnetic design. Moreover, it is conceivable to use a mechanical/magnetic expansion unit. It is furthermore conceivable to form an expansion unit and a contraction unit in such a way that they are at least in part integral, thereby making it possible, in particular, to further improve installation space efficiency. Moreover, an expansion unit could also have a plurality of expansion elements. In addition, at least one expansion unit could also be designed as any kind of elastic element different from a spring element, e.g. as a silicone element and/or rubber element.

In the present case, the actuator device furthermore comprises a detection unit 38a. The detection unit 38a is configured for the purpose of a detection of at least one actuation parameter correlated with the movement of the actuation element 12a. In the present case, the detection unit 38a is configured for the purpose of indirectly detecting a deformation of the actuator element 10a.

For this purpose, the detection unit 38a comprises at least one sensor 56a. In the present case, the detection unit 38a comprises precisely one sensor 56a. The sensor 56a is arranged in the vicinity of the actuator element 10a. The sensor 56a is arranged within the actuator housing 48a. The sensor 56a is formed at least in part integrally with the contraction unit 18a. In the present case, the sensor 56a is identical with the magnet element 22a. The sensor 56a is configured for the purpose of a detection of the actuation parameter. In the present case, the actuation parameter is an induction voltage caused by a deformation of the actuator element 10a and/or an induction current caused by a deformation of the actuator element 10a.

The detection unit 38a is configured for the purpose of transmitting a signal, in particular a signal detected by means of the sensor 56a, to an evaluation unit (not illustrated) of the actuator device. The evaluation unit is configured for the purpose of determining a movement of the actuation element 12a in accordance with the signal supplied by the detection unit 38a. As an alternative, it is conceivable to dispense completely with a detection unit and/or an evaluation unit. Moreover, it would also be possible for a sensor to be arranged outside an actuator housing. Furthermore, a detection unit could also comprise a plurality of sensors, whereby, in particular, advantageously precise detection of a movement of an actuation element can be achieved.

Further illustrative embodiments of the invention are shown in FIGS. 4 to 11. The following descriptions and the drawings are limited substantially to the differences between the illustrative embodiments, wherein it is also possible in principle, in respect of identically designated components, in particular in respect of components with the same reference signs, to refer to the drawings and/or the description of the other illustrative embodiments, in particular FIGS. 1 to 3. To distinguish the illustrative embodiments, the letter a is added to the reference signs of the illustrative embodiment in FIGS. 1 to 3. In the illustrative embodiments in FIGS. 4 to 11, the letter a is replaced by the letters b to h.

FIG. 4 shows another illustrative embodiment of the invention. The letter b is added to the illustrative embodiment in FIG. 4. The further illustrative embodiment in FIG. 4 differs from the previous illustrative embodiment at least essentially by a configuration of a contraction unit 18b.

In the present case, the contraction unit 18b comprises a magnet element 24b designed as a spiral spring for supplying a magnetic field for the contraction of an actuator element 10b.

Moreover, the contraction unit 18b comprises at least one flux concentrator 28b, 30b. In the present case, the contraction unit 18a comprises two flux concentrators 28b, 30b. The flux concentrators 28b, 30b are composed of iron. The flux concentrators 28b, 30b are arranged directly opposite in relation to the actuator element 10b. The flux concentrators 28b, 30b are arranged in opposite axial end regions of the actuator element 10b. Here, the flux concentrators 28b, 30b do not form a fully closed magnetic circuit.

A first flux concentrator 28b of the flux concentrators 28b, 30b is arranged in the vicinity of a first axial end of the actuator element 10b. Here, the first flux concentrator 28b is arranged between the actuator element 10b and an actuation element (not illustrated). In the present case, the first flux concentrator 28b is formed integrally with the actuation element. Moreover, the first flux concentrator 28b is connected for conjoint movement to the actuator element 10b.

A second flux concentrator 30b of the flux concentrators 28b, 30b is arranged in the vicinity of a second axial end of the actuator element 10b. Here, the second flux concentrator 30b is arranged between the actuator element 10b and an actuator housing (not illustrated).

The flux concentrators 28b, 30b are configured for the purpose of intensifying a magnetic field of the magnet element 24b which acts on the actuator element 10b. As an alternative, it is conceivable to dispense with at least one of the flux concentrators.

Moreover, a contraction unit could also have a different number of flux concentrators, e.g. at least four, at least six and/or at least eight flux concentrators. Moreover, it is conceivable to form flux concentrators from a material other than iron. It is furthermore conceivable to dispense completely with flux concentrators.

A further illustrative embodiment of the invention is shown in FIGS. 5 to 6b. The letter c is added to the illustrative embodiment in FIGS. 5 to 6b. The further illustrative embodiment in FIGS. 5 to 6b differs from the previous illustrative embodiments at least essentially by a configuration of a contraction unit 18c.

In the present case, the contraction unit 18c for supplying a magnetic field for the contraction of an actuator element (not illustrated) comprises a magnet element 26c consisting of stacked and joined disk springs 58c. In this case, by way of example, the magnet element 26c comprises three disk springs 58c. The disk springs 58c are connected integrally to one another. For this purpose, each of the disk springs 58c is slotted and bent open (see FIGS. 6a and 6b). As a result, the magnet element 26c is formed as an elastic element and has resilient and/or restoring properties. As an alternative, however, it would also be possible in this case for a magnet element to have any other number of disk springs, e.g. at least five and/or at least eight disk springs.

In addition, the contraction unit 18c is in this case formed at least in part integrally with an expansion unit 32c. In the present case, the magnet element 26c is identical with an expansion element 34c of the expansion unit 32c.

FIG. 7 shows another illustrative embodiment of the invention. The letter d is added to the illustrative embodiment in FIG. 7. The further illustrative embodiment in FIG. 7 differs from the previous illustrative embodiments at least essentially by a configuration of an expansion unit 32d.

In the present case, the expansion unit 32d is designed as a mechanical expansion unit and comprises two expansion elements 34d, 35d. The expansion elements 34d, 35d are formed separately from one another. The expansion elements 34d, 35d are arranged on different sides of the actuator element 10d in a direction perpendicular to a direction of longitudinal extent of an actuator element 10d. The expansion elements 34d, 35d are of identical design to one another. The expansion elements 34d, 35d are designed as elastic elements. The expansion elements 34d, 35d are designed as spring elements, in particular in the present case as a leaf spring and/or spring plate.

The expansion elements 34d, 35d are furthermore operatively connected to the actuator element 10d. In the present case, the expansion elements 34d, 35d make contact with the actuator element 10d, in particular on opposite longitudinal sides of the actuator element 10d.

The expansion elements 34d, 35d are configured for the purpose of exerting a force on the actuator element 10d and thereby transmitting a pressure force to an actuation element (not illustrated). In the present case, the expansion elements 34d, 35d are configured for the purpose of transmitting a force to the actuator element 10d in such a way that the actuation element moves in another direction of movement 16a, in particular after a contraction of the actuator element 10d by a contraction unit (not illustrated). The expansion elements 34d, 35d are thus configured for the purpose of causing an expansion, in particular a mechanical expansion, of the actuator element 10d, which is, in particular, connected for conjoint movement to the actuation element, in at least one state of use and thereby causing a movement of the actuation element in the other direction of movement 16d.

FIG. 8 shows another illustrative embodiment of the invention. The letter e is added to the illustrative embodiment in FIG. 8. The further illustrative embodiment in FIG. 8 differs from the previous illustrative embodiments at least essentially by a configuration of an expansion unit 32e.

In this case, the expansion unit 32e is designed as a magnetic expansion unit. The expansion unit 32e is of passive design and, in particular, does not have any possibility of active control. The expansion unit 32e is configured for the purpose of expanding the actuator element 10e.

The expansion unit 32e is configured for the purpose of supplying a further magnetic field that acts on the actuator element 10e. The expansion unit 32e is configured for the purpose of influencing a deformation of the actuator element 10e, in particular by means of the further magnetic field. In the present case, the expansion unit 32e is configured for the purpose of causing an expansion and/or a reset of the actuator element 10e by means of the further magnetic field and thereby producing a movement of an actuation element 12e in another direction of movement 16e. In this case, the expansion element 32e is configured for the purpose of supplying a magnetic field, wherein, in the region of the actuator element 10e, field lines 60e of the magnetic field are aligned at least substantially perpendicularly to the other direction of movement 16e and/or to the direction of longitudinal extent of the actuator element 10e.

For this purpose, the expansion unit 32e comprises an expansion element 36e designed as a permanent magnet. The expansion element 36e is operatively connected to the actuator element 10e. Here, the expansion element 36e is composed of a permanent magnet material, preferably a hard-magnetic material, which, in particular, has a coercive field strength of at least 1 kA/m and advantageously at least 50 kA/m. In the present case, the expansion element 36e is designed as a rare earth magnet and, in particular, is composed of samarium cobalt. As an alternative, however, it would also be possible in this case for an expansion element to be composed at least partially, preferably at least in large part and particularly preferably completely of neodymium-iron-boron, a neodymium-iron-boron alloy and/or a samarium-cobalt alloy.

The expansion element 36e is configured for the purpose of exerting a force on the actuator element 10e and thereby transmitting a pressure force to the actuation element 12e. In the present case, the expansion element 36e is configured for the purpose of transmitting a magnetic force to the actuator element 10e in such a way that the actuation element 12e moves in the other direction of movement 16e, in particular after a contraction of the actuator element 10e by a contraction unit (not illustrated). The expansion element 36e is thus configured for the purpose of causing an expansion, in particular a magnetic expansion, of the actuator element 10e, which is, in particular, connected for conjoint movement to the actuation element 12e, in at least one state of use and thereby causing a movement of the actuation element 12e in the other direction of movement 16e.

A further illustrative embodiment of the invention is shown in FIG. 9. The letter f is added to the illustrative embodiment in FIG. 9. The further illustrative embodiment in FIG. 9 shows an example of the use of an actuator corresponding to the preceding illustrative embodiments.

FIG. 9 shows a valve 42f designed, by way of example, as an in-line valve. The valve 42f is designed as a fluid valve, in the present case, in particular, as a pneumatic valve. The valve 42f is of controllable design. In this case, the valve 42f is designed as a fast-switching valve.

The valve 42f comprises an actuator 40f having an actuator device according to the invention. Here, the actuator 40f correspond substantially to an actuator in the preceding illustrative embodiments.

In this case, however, an actuator housing 48f is designed as a fluid housing and has an inlet opening 62f for the introduction of a fluid flow, in the present case, in particular, a gaseous fluid flow, and an outlet opening 64f for discharge of the fluid flow.

Moreover, an actuation element 12f connected, in particular, for conjoint movement to an actuator element 10f is designed as a valve needle.

A further illustrative embodiment of the invention is shown in FIG. 10. The letter g is added to the illustrative embodiment in FIG. 10. The further illustrative embodiment in FIG. 10 shows a further example of the use of an actuator corresponding to the preceding illustrative embodiments.

FIG. 10 shows a further illustrative embodiment of a valve 42g, which comprises an actuator 40g having an actuator device according to the invention, in a front view.

In this case, a magnet element 22g of a contraction unit 18g is arranged within an actuator housing 48g in such a way that the magnet element 22g makes contact with an inner side of the actuator housing 48g. In this case, power is supplied to the magnet element 22g directly via the actuator housing 48g by means of supply electronics (not illustrated) of the actuator device, thus making it possible to dispense with an additional supply contact and advantageously to reduce expenditure on contact making.

A further illustrative embodiment of the invention is shown in FIG. 11. The letter h is added to the illustrative embodiment in FIG. 11. The further illustrative embodiment in FIG. 11 shows a further example of the use of a plurality of actuators corresponding to the preceding illustrative embodiments.

FIG. 11 shows an illustrative embodiment of a valve system 44h in a schematic front view. The valve system 44h can be configured for use in sorting systems, especially rice sorting systems, for example.

The valve system 44h has a valve block 46h. The valve block 46h has a multiplicity of recesses 66h of identical design distributed uniformly over the valve block 46h.

Moreover, the valve system 44h comprises a multiplicity of valves 42h. The valves 42h correspond substantially to the valves 42f, 42g illustrated in FIGS. 9 and 10. Each of the valves 42h thus comprises an actuator having an actuator device according to the invention. The valves 42h are designed as pneumatic valves. The valves 42h are designed as in-line valves. In this case, the valves 42h are arranged in the valve block 46h, in particular in the recesses 66h in the valve block 46h. In the present case, one of the valves 42h is arranged in each of the recesses 66h.

In this case, the valves 42h are arranged in the valve block 46h in such a way that directly adjacent valves 42h have a minimum distance of at most 10 mm and advantageously of at most 7 mm. It is thereby possible to provide a valve system 44h with an advantageously small grid dimension of at most 10 mm, thereby, in particular, enabling an improved sorting function to be achieved.

Moreover, the configuration of the valve block 46h makes it possible to combine inlet openings and/or supply contacts. Thus, for example, a central inlet can be created and/or, by combining an electric terminal, e.g. by means of an embodiment in accordance with FIG. 10, a number of electric contact points and thus expenditure on contact making can be significantly reduced.

The invention claimed is:

1. An actuator device
having at least one actuator element, which consists at least partially of a magnetically
shape-shiftable material and which is configured at least for a purpose of causing a movement of at
least one actuation element in at least one direction of movement by means of a contraction, and
having a magnetic contraction unit, which is configured for the purpose of supplying a
magnetic field acting upon the at least one actuator element in order to generate a contraction of the at
least one actuator element in the longitudinal direction of extent of the at least one actuator element,
wherein, in a region of the at least one actuator element, field lines of the magnetic field
are aligned at least substantially parallel to the at least one direction of movement,
wherein the magnetically shape-shiftable material is a magnetic shape-memory alloy
which contains nickel, manganese, and gallium,
wherein the magnetic contraction unit comprises a coil unit that surrounds the at least one
actuator element at least partially, which is configured for the purpose of generating a magnetic
field acting on the at least one actuator element in at least one operating state and thereby
causing the contraction of the at least one actuator element,
wherein the magnetic contraction unit has two flux concentrators, which are configured
for the purpose of intensifying the magnetic field acting on the at least one actuator element,
wherein the two flux concentrators are arranged in opposing axial end regions of the at least one actuator element, and
wherein the flux concentrators do not form a fully closed magnetic circuit.

2. The actuator device as claimed in claim 1,
wherein the at least one actuator element is configured at least for a purpose of transmitting a tensile force onto the at least one actuation element.

3. The actuator device as claimed in claim 1,
wherein the magnetic field causes a change in a length of the at least one actuator element in the at least one direction of movement of at least 2%.

4. The actuator device as claimed in claim 1,
comprising the at least one actuation element, to which the at least one actuator element is rigidly connected.

5. The actuator device as claimed in claim 1,
wherein the magnetic contraction unit for supplying the magnetic field comprises at least one magnet element embodied as an air-core coil.

6. The actuator device as claimed in claim 1,
wherein the magnetic contraction unit for supplying the magnetic field comprises at least one magnet element embodied as a ribbon coil.

7. The actuator device as claimed in claim 1,
wherein the magnetic contraction unit for supplying the magnetic field comprises at least one magnet element consisting of stacked disk springs.

8. The actuator device as claimed in claim 1,
comprising a detection unit, which is configured for a detection of at least one actuation parameter that is correlated with the movement of the at least one actuation element,
wherein the at least one actuation parameter is an induction voltage caused by a deformation of the at least one actuator element and/or an induction current caused by a deformation of the at least one actuator element.

9. A method for operating the actuator device, in particular as claimed in claim 1, which has at least one actuator element, which consists at least partially of a magnetically shape-shiftable material,
wherein the at least one actuator element is contracted by means of a magnetic field acting on the at least one actuator element and a movement of at least one actuation element in at least one direction of movement is caused by means of the contraction of the at least one actuator element,
wherein, in the longitudinal direction of extent of the at least one actuator element, and in the region of the at least one actuator element, field lines of the magnetic field are aligned at least substantially parallel to the at least one direction of movement.

10. The actuator device as claimed in claim 1,
wherein the magnetically shape-shiftable material is of monocrystalline configuration.

11. The actuator device as claimed in claim 10,
wherein the magnetically shape-shiftable material has a tetragonal crystal structure with lattice constants a, b=a and c, wherein c/a<1, and the magnetically shape-shiftable material has a magnetic anisotropy, and
wherein a magnetic permeability is greater in a direction of a c-axis than along an a-axis and a b-axis.

12. The actuator device as claimed in claim 1,
wherein the magnetic contraction unit has at least one flux concentrator, which is configured for a purpose of intensifying the magnetic field acting on the at least one actuator element.

13. The actuator device as claimed in claim 12,
wherein the at least one flux concentrator is arranged in an axial end region of the at least one actuator element.

14. The actuator device as claimed in claim 1, comprising an expansion unit, which is configured for an expansion of the at least one actuator element.

15. The actuator device as claimed in claim 14, wherein the expansion unit comprises at least one expansion element that is embodied as an elastic element, in particular a spring element.

16. The actuator device as claimed in claim 14, wherein the expansion unit comprises at least one expansion element that is embodied as a permanent magnet.

17. A valve, in particular a pneumatic valve, having at least one actuator, which has the actuator device as claimed in claim 1.

18. A valve system having a valve block and a plurality of valves as claimed in claim 17 arranged in the valve block, wherein the plurality of valves have a minimum distance, in particular a grid dimension, of at most 10 mm, preferably of at most 7 mm.

* * * * *